United States Patent
Yamaguchi et al.

(10) Patent No.: US 12,529,958 B2
(45) Date of Patent: Jan. 20, 2026

(54) PHOTOSENSITIVE RESIN COMPOSITION, METHOD FOR PRODUCING RESIN FILM HAVING PATTERN, RESIN FILM HAVING PATTERN, AND SEMICONDUCTOR CIRCUIT SUBSTRATE

(71) Applicant: JSR CORPORATION, Tokyo (JP)

(72) Inventors: Torahiko Yamaguchi, Tokyo (JP); Kimiyuki Kanno, Tokyo (JP); Ryoji Tatara, Tokyo (JP); Toshiaki Kadota, Tokyo (JP); Ryoyu Hifumi, Tokyo (JP); Shoma Anabuki, Tokyo (JP)

(73) Assignee: JSR CORPORATION, Tokyo (JP)

( * ) Notice: Subject to any disclaimer, the term of this patent is extended or adjusted under 35 U.S.C. 154(b) by 66 days.

(21) Appl. No.: 17/261,902

(22) PCT Filed: May 17, 2019

(86) PCT No.: PCT/JP2019/019657
§ 371 (c)(1),
(2) Date: Jan. 21, 2021

(87) PCT Pub. No.: WO2020/021827
PCT Pub. Date: Jan. 30, 2020

(65) Prior Publication Data
US 2021/0286262 A1   Sep. 16, 2021

(30) Foreign Application Priority Data
Jul. 25, 2018 (JP) ................. 2018-139385

(51) Int. Cl.
*G03F 7/028* (2006.01)
*C08G 65/40* (2006.01)
*G03F 7/004* (2006.01)
*G03F 7/038* (2006.01)
*G03F 7/32* (2006.01)
*G03F 7/40* (2006.01)

(52) U.S. Cl.
CPC ............ *G03F 7/028* (2013.01); *C08G 65/40* (2013.01); *G03F 7/0045* (2013.01); *G03F 7/0382* (2013.01); *G03F 7/325* (2013.01); *G03F 7/40* (2013.01)

(58) Field of Classification Search
CPC ...... G03F 7/0045; G03F 7/0382; G03F 7/028; C08G 65/40; C08G 65/4031; C08G 65/4037; C08G 65/42; C08G 65/44; C08G 65/485; C08G 65/34; C08L 71/10; C08L 71/12
See application file for complete search history.

(56) References Cited

U.S. PATENT DOCUMENTS

| | | | | |
|---|---|---|---|---|
| 7,615,324 B2 * | 11/2009 | Sato | ...................... | G03F 7/0233 430/326 |
| 2010/0080963 A1 * | 4/2010 | Hikita | .................... | G03F 7/0392 430/311 |
| 2011/0224386 A1 * | 9/2011 | Weber | ..................... | C08L 63/00 525/534 |
| 2014/0272722 A1 * | 9/2014 | Nakafuji | ............... | G03F 7/0384 528/211 |
| 2017/0154782 A1 * | 6/2017 | Nakafuji | ................. | C08G 65/40 |
| 2017/0369649 A1 * | 12/2017 | Nawate | ................... | C08L 71/10 |

FOREIGN PATENT DOCUMENTS

| | | | |
|---|---|---|---|
| CN | 105061754 A | * | 11/2015 |
| JP | H06-180501 A | | 6/1994 |
| JP | 2006178059 A | | 7/2006 |
| JP | 2012226297 A | | 11/2012 |
| JP | 2014186300 A | | 10/2014 |
| JP | 2015151491 A | * | 8/2015 |
| JP | 2017015890 A | | 1/2017 |
| KR | 20140104420 A | | 8/2014 |
| WO | WO-2016143447 A1 | * | 9/2016 ............. C08G 65/40 |

OTHER PUBLICATIONS

English translation of CN105061754. (Year: 2015).*
English translation of JP2015151491. (Year: 2015).*
International Search Report issued Jul. 30, 2019 in PCT/JP2019/019657 (with English translation), 5 pages.

(Continued)

*Primary Examiner* — Mark F. Huff
*Assistant Examiner* — Anna Malloy
(74) *Attorney, Agent, or Firm* — Element IP, PLC

(57) ABSTRACT

A photosensitive resin composition contains: a polymer (A) having a terminal group represented by Formula (a1) and a repeating structural unit represented by Formula (a2); a crosslinking agent (B); and a photocation generator (C). Y represents a reactive group that reacts with the crosslinking agent (B) by action of a cation generated from the photocation generator (C) upon light irradiation; each X independently represents an oxygen atom, a sulfur atom, an ester bond, an amide bond, or —$SO_2$—; $R^1$ represents a divalent hydrocarbon group or a divalent group in which a functional group other than the reactive group and heterocycles is introduced into the divalent hydrocarbon group; and $R^2$ represents a divalent hydrocarbon group, a divalent group in which a functional group other than the reactive group and heterocycles is introduced into the divalent hydrocarbon group, or a heterocycle-containing group that does not have the reactive group.

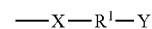

(a1)

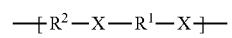

(a2)

15 Claims, No Drawings

(56) References Cited

OTHER PUBLICATIONS

Office Action issued Dec. 13, 2022 in JP Patent Application No. 2020-532177 (with English translation), 5 pages.
Combined Office Action and Search Report issued Sep. 29, 2022 in Taiwanese Patent Application No. 108120179 (with English translation), 6 pages.
Office Action issued Oct. 4, 2023 in Korean Patent Application No. 10-2021-7004178 (with English translation), 11 pages.
Combined Chinese Office Action issued Nov. 28, 2023, in corresponding Chinese Patent Application No. 201980047806.7 (with English translation), 16 pages.
Office Action issued Jun. 14, 2024, in corresponding Chinese Patent Application No. 201980047806.7 (with English translation), 15 pages.
Office Action issued Oct. 11, 2024, in corresponding Chinese Patent Application No. 201980047806.7 (with English translation), 16 pages.

* cited by examiner

PHOTOSENSITIVE RESIN COMPOSITION, METHOD FOR PRODUCING RESIN FILM HAVING PATTERN, RESIN FILM HAVING PATTERN, AND SEMICONDUCTOR CIRCUIT SUBSTRATE

TECHNICAL FIELD

The present invention relates to a photosensitive resin composition, a method for producing a resin film having a pattern, a resin film having a pattern, and a semiconductor circuit substrate.

BACKGROUND ART

In high-speed mobile communication devices, high-frequency electric signals are used to enhance processing speed. In a semiconductor circuit substrate used in high-speed mobile communication devices, a high-frequency electric signal drastically changes electric field. For this reason, an insulating film of the semiconductor circuit substrate has dielectric loss, accompanied by signal delay and heat generation of the insulating film, for which measures have been taken.

As a measure for such heat generation of the insulating film, in order to decrease dielectric loss in the insulating film, an insulating film has been developed that has low dielectric constant and low dielectric loss tangent in a high-frequency region (for example, see Patent Literature 1).

CITATION LIST

Patent Literature

Patent Literature 1: JP 2017-015890 A

SUMMARY OF INVENTION

Technical Problem

As a measure for heat generation of an insulating film, a thin silicon interposer is used on a semiconductor circuit substrate to dissipate heat. However, the silicon interposer and the insulating film are different in thermal linear expansion coefficient. Unfortunately, when the insulating film has small elongation properties, heat may cause warpage or breakage in the thin silicon interposer.

Further, an insulating film for use in a semiconductor circuit substrate is used between electrode pads or between wirings arranged at fine pitches. Therefore, a composition for forming a resin film having a pattern (hereinafter, also referred to as "patterned resin film") such as an insulating film having a pattern requires photolithography properties capable of patterning with exposure and development.

The present invention is to solve the problems described above, that is, an object of the present invention is to provide a photosensitive resin composition that can form a resin film having low dielectric constant and low dielectric loss tangent and being superior in elongation properties and that has photolithography properties; a patterned resin film that has low dielectric constant and low dielectric loss tangent and is superior in elongation properties, and a method for producing the same; and a semiconductor circuit substrate including a patterned resin film that has low dielectric constant and low dielectric loss tangent and is superior in elongation properties.

Solution to Problem

The present inventors have made intensive investigations to solve the problems described above. As a result, the present inventors have found out that the photosensitive resin composition having the following composition can solve the problems described above, and completed the present invention. The present invention is, for example, the following [1] to [9].

[1] A photosensitive resin composition containing: a polymer (A) having a terminal group represented by Formula (a1) and a repeating structural unit represented by Formula (a2); a crosslinking agent (B); and a photocation generator (C),

[chem. 1]

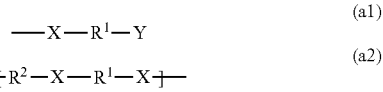

wherein in Formula (a1) and Formula (a2), Y represents a reactive group that reacts with the crosslinking agent (B) by action of a cation generated from the photocation generator (C) upon light irradiation; each X independently represents an oxygen atom, a sulfur atom, an ester bond, an amide bond, or $-SO_2-$; $R^1$ represents a divalent hydrocarbon group or a divalent group in which a functional group other than the reactive group and heterocycles is introduced into the divalent hydrocarbon group; and $R^2$ represents a divalent hydrocarbon group, a divalent group in which a functional group other than the reactive group and heterocycles is introduced into the divalent hydrocarbon group, or a heterocycle-containing group that does not have the reactive group.

[2] The photosensitive resin composition according to [1], wherein the reactive group is a phenolic hydroxyl group.

[3] The photosensitive resin composition according to [1] or [2], wherein $R^1$ is an arylene group.

[4] The photosensitive resin composition according to any one of [1] to [3], wherein $R^2$ is a divalent group in which two hydrogen atoms are removed from pyrimidine, or an arylene group.

[5] The photosensitive resin composition according to any one of [1] to [4], wherein the crosslinking agent (B) is a crosslinking agent that has at least two methylol groups or alkoxymethyl groups.

[6] The photosensitive resin composition according to any one of [1] to [5], wherein the polymer (A) is a linear polymer.

[7] A method for producing a resin film having a pattern, the method including: a step (1) of forming a coating film of the photosensitive resin composition according to any one of [1] to [6] on a substrate; a step (2) of selectively exposing the coating film; and a step (3) of developing the coating film after exposure with a developing solution containing an organic solvent.

[8] A resin film having a pattern, the resin film being formed by the production method according to [7].

[9] A semiconductor circuit substrate including the resin film having a pattern according to [8].

Advantageous Effects of Invention

The present invention can provide a photosensitive resin composition that can form a resin film having low dielectric constant and low dielectric loss tangent and being superior in elongation properties and that has photolithography properties; a patterned resin film that has low dielectric constant and low dielectric loss tangent and is superior in elongation properties, and a method for producing the same; and a semiconductor circuit substrate including a patterned resin film that has low dielectric constant and low dielectric loss tangent and is superior in elongation properties.

DESCRIPTION OF EMBODIMENTS

Hereinafter, embodiments of the present invention will be explained together with suitable aspects.
[Photosensitive Resin Composition]
A photosensitive resin composition (hereinafter, also simply referred to as "composition of the present invention") of the present invention contains a polymer (A), a crosslinking agent (B), and a photocation generator (C) explained below.
<Polymer (A)>
A polymer (A) has a terminal group (hereinafter also referred to as "terminal group (a1)") represented by Formula (a1) and a repeating structural unit (hereinafter also referred to as "repeating structural unit (a2)") represented by Formula (a2).

[chem. 2]

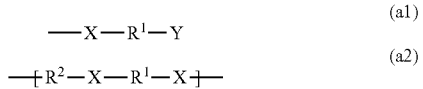

(a1)
(a2)

The polymer (A) may be a polymer having one type of repeating structural unit (a2) or a polymer having two or more types of repeating structural units (a2).
Each symbol in Formula (a1) and Formula (a2) means as follows.
<<Y>>
Y in Formula (a1) represents a reactive group. The reactive group is a group that reacts with a crosslinking agent (B) by action of a cation generated from a photocation generator (C) upon light irradiation. The cation facilitates a crosslinking reaction between the polymer (A) and the crosslinking agent (B). Y is, for example, a group represented by —X—H (X is synonymous with X in Formula (a1)).
Examples of the reactive group include a hydroxyl group, a thiol group, an amino group, a sulfonic acid group, and a carboxy group. The reactive group is preferably a phenolic hydroxyl group, since the use of the composition of the present invention enables the formation of a patterned resin film that has low dielectric constant and low dielectric loss tangent and is superior in elongation properties, and the polymer (A) is superior in solubility in an organic solvent and preservation stability.
<<X>>
Each X in Formula (a1) and Formula (a2) independently represents an oxygen atom, a sulfur atom, an ester bond, an amide bond, or —SO$_2$—. Among these, an oxygen atom and an ester bond are preferable, since the use of the composition of the present invention enables the formation of a patterned resin film that has low dielectric constant and low dielectric loss tangent and is superior in elongation properties, and the polymer (A) is superior in solubility in an organic solvent and preservation stability.

<<R$^1$ and R$^2$>>
In Formula (a1), R$^1$ represents a divalent hydrocarbon group or a divalent group (hereinafter also referred to as "divalent substituted hydrocarbon group") in which a functional group other than the reactive group and heterocycles is introduced into the divalent hydrocarbon group.
R$^2$ in Formula (a2) represents a divalent hydrocarbon group, a divalent substituted hydrocarbon group, or a heterocycle-containing group that does not have the reactive group.
R$^1$ is preferably a divalent hydrocarbon group. R$^2$ is preferably a heterocycle-containing group that does not have the reactive group or a divalent hydrocarbon group, and more preferably a heterocycle-containing group that does not have the reactive group. Such an aspect is preferable, since the polymer (A) has a small dipole moment in the minor axis direction (a direction perpendicular to the main chain direction of the polymer (A)), and the use of the composition of the present invention enables the formation of a patterned resin film that has low dielectric constant and low dielectric loss tangent and is superior in elongation properties.
(Divalent Hydrocarbon Group)
Examples of the divalent hydrocarbon group in R$^1$ and R$^2$ include alkanediyl groups, alicycle-containing hydrocarbon groups, and aromatic ring-containing hydrocarbon groups. Among these, aromatic ring-containing hydrocarbon groups are preferable, since the use of the composition of the present invention enables the formation of a patterned resin film that is superior in heat resistance. Here, a hydrocarbon group that has both an alicycle and an aromatic ring is classified as an aromatic ring-containing hydrocarbon group.
The carbon number of the alkanediyl group is usually 1 to 30, and preferably 1 to 20. Examples of the alkanediyl group include linear alkanediyl groups such as a methylene group, an ethylene group, a propane-1,3-diyl group, a butane-1,4-diyl group, a hexane-1,6-diyl group, an octane-1,8-diyl group, and a decane-1,10-diyl group; and branched-chain alkanediyl groups obtained by addition of one or a plurality of side chains of an alkyl group having 1 to 4 carbon atoms to the linear alkanediyl groups exemplified above.
The carbon number of the alicycle-containing hydrocarbon group is usually 3 to 30, and preferably 5 to 20. Examples of the alicycle, that is an aliphatic hydrocarbon ring, include monocyclic aliphatic hydrocarbon rings such as a cyclobutane ring, a cyclopentane ring, a cyclohexane ring, a cycloheptane ring, and a cyclodecane ring; and polycyclic aliphatic hydrocarbon rings such as a norbornane ring, a norbornene ring, an adamantane ring, a tricyclo[5.2.1.0$^{2,6}$]decane ring, and a tricyclo[5.2.1.0$^{2,6}$]heptane ring. The alicycle-containing hydrocarbon group can have the aliphatic hydrocarbon ring, for example, as a monovalent group (e.g. cycloalkyl group) or as a divalent group (e.g. cycloalkanediyl group); and examples include a group in which at least one hydrogen atom in an alkanediyl group is substituted with a monovalent aliphatic hydrocarbon ring, and a group in which a divalent aliphatic hydrocarbon ring is connected to an alkanediyl group.
Examples of the aromatic ring-containing hydrocarbon group include an arylene group and a divalent group represented by —R$^3$—Ar—R$^3$—. In the formula, Ar is an arylene group; and each R$^3$ is independently an alkanediyl group (the carbon number of the alkanediyl group is usually 1 to 6).
In the present specification, the arylene group refers to a divalent hydrocarbon group that has one or more aromatic rings, that is, aromatic hydrocarbon rings, and two bonding hands are present in the aromatic hydrocarbon rings. When the arylene group has a plurality of aromatic hydrocarbon rings, the two bonding hands described above may present in the same aromatic hydrocarbon ring or in different aromatic hydrocarbon rings.

Examples of the aromatic hydrocarbon ring included in the arylene group include a benzene ring; and benzo-fused rings such as a naphthalene ring, an anthracene ring, a tetrazene ring, and a pentacene ring. The carbon number of the arylene group is preferably 6 to 50, and more preferably 6 to 30.

Examples of the arylene group include a phenylene group, a naphthalenediyl group, an anthracenediyl group, a tetracenediyl group, a pentacenediyl group, and divalent groups represented by any of the four formulae described below. Each aromatic hydrocarbon ring (e.g. benzene ring) contained in these groups can have one or more substituents. Examples of the substituent include alkyl groups, cycloalkyl groups, aryl groups, and aralkyl groups, having 1 to 30 carbon atoms. When the aromatic hydrocarbon ring has two or more substituents, substituents may be the same or different from each other.

[chem. 3]

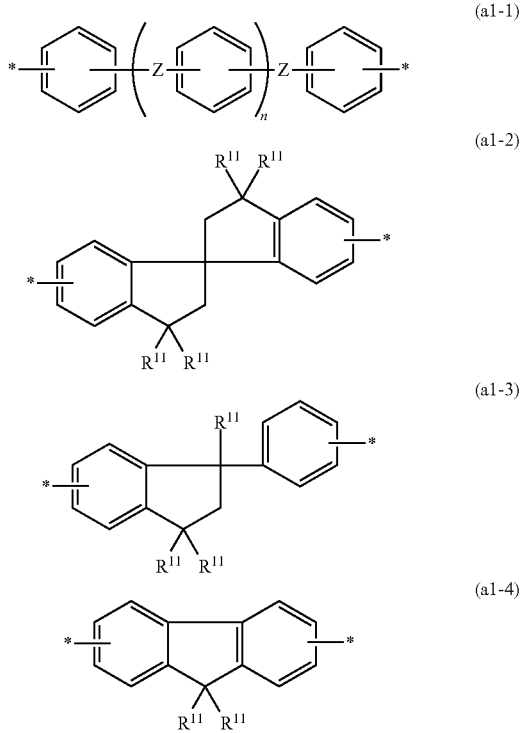

* is a bonding hand in the above formulae.

In the above formulae, each Z is independently a single bond, or a divalent hydrocarbon group having 1 to 20 carbon atoms; and preferably a divalent hydrocarbon group having 1 to 20 carbon atoms. n is an integer of 0 to 3. Examples of the divalent hydrocarbon group having 1 to 20 carbon atoms include alkanediyl groups such as a methylene group, an ethylene group, a 1,1-dimethylmethane-1,1-diyl group, a decane-1,1-diyl group; aryl group-substituted alkanediyl groups such as a diphenylmethylene group; cycloalkanediyl groups such as a cyclohexane-1,1-diyl group and a 3,3,5-trimethylcyclohexane-1,1-diyl group; a phenylene group, and a fluorenylidene group.

In the above formulae, each $R^{11}$ is independently a hydrogen atom or an alkyl group, and preferably an alkyl group having 1 to 10 carbon atoms.

(Divalent Substituted Hydrocarbon Group)

The divalent substituted hydrocarbon group in $R^1$ and $R^2$ is a group in which a functional group other than the reactive group and heterocycles is introduced into the divalent hydrocarbon group. For example, the functional group is selected from halogen atoms, a nitro group, a cyano group, an allyl group, and a vinyl group, and is a group other than the reactive group. The functional group is preferably not a functional group having high polarity such as a hydroxyl group, from the viewpoint of low dielectric characteristics.

(Heterocycle-Containing Group)

Examples of the heterocycle-containing group that does not have the reactive group in $R^2$ include heteroaromatic ring-containing groups. Examples of the heteroaromatic ring include N-containing aromatic rings such as a pyrimidine ring, a pyrazine ring, a pyridazine ring, a pyridine ring, a pyrrole ring, and a pyrazole ring; O-containing aromatic rings such as a furan ring: S-containing aromatic rings such as a thiophene ring; N- and O-containing aromatic rings such as an isoxazole ring; and N- and S-containing aromatic rings such as an isothiazole ring.

The heterocycle may have one or more, for example, 1 or 2 substituents that are bonded to the heterocycle. For example, the substituent is selected from halogen atoms, monovalent hydrocarbon groups having 1 to 20 carbon atoms such as alkyl groups, cycloalkyl groups, aryl groups, an allyl group, and a vinyl group, monovalent halogenated hydrocarbon groups having 1 to 20 carbon atoms, a nitro group, and a cyano group, and is a group other than the reactive group. The functional group is preferably not a functional group having high polarity such as a hydroxyl group, from the viewpoint of low dielectric characteristics. The carbon number of the hydrocarbon group and the halogenated hydrocarbon group is preferably 1 to 3. When the heterocycle has two or more substituents, substituents may be the same or different from each other.

Among the heteroaromatic ring-containing groups, a divalent group in which two hydrogen atoms are removed from pyrimidine, pyrazine, or pyridazine is preferable, and a divalent group in which two hydrogen atoms are removed from pyrimidine is more preferable, since the use of the composition of the present invention enables the formation of a patterned resin film that is superior in low dielectric constant and low dielectric loss tangent.

<<Preferable Configurations>>

In Formula (a1) and Formula (a2), $R^1$ is preferably an aromatic ring-containing hydrocarbon group, and more preferably an arylene group.

In Formula (a2), $R^2$ is preferably a heterocycle-containing group that does not have the reactive group, and more preferably a divalent group in which two hydrogen atoms are removed from pyrimidine, pyrazine, or pyridazine.

The polymer (A) has, in Formula (a2), preferably a repeating structural unit in which $R^1$ is an aromatic ring-containing hydrocarbon group and $R^2$ is a heterocycle-containing group that does not have the reactive group, and more preferably a repeating structural unit in which $R^1$ is an arylene group and $R^2$ is a divalent group in which two hydrogen atoms are removed from pyrimidine, pyrazine, or pyridazine. In such an aspect, the use of the composition of the present invention enables the formation of a patterned resin film that is superior in low dielectric constant and low dielectric loss tangent.

The polymer (A) is preferably a linear polymer that has the repeating structural unit (a2) and has the terminal group (a1) at a polymer chain terminal, and particularly preferably a linear polymer, such as a polymer (AA) represented by Formula (AA), in which X in the repeating structural unit (a2) is the same X in the case where Y in the terminal group (a1) is a group represented by —X—H, since the use of the composition of the present invention enables the formation of a patterned resin film that is superior in elongation properties.

[chem. 4]

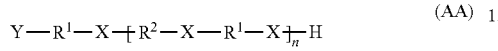

(AA)

In Formula (AA), $R^1$, $R^2$, X, and Y are respectively synonymous with the same symbols in Formula (a1) and Formula (a2). n represents that the structure in [ ] is a repeating structural unit. That is, the repeating structural units (a2) are bonded as . . . —$R^2$—X—$R^1$—X—$R^2$—X—$R^1$—X . . . . The repeating structural unit (a2) may be one type or two or more types.

<<Configuration of Polymer (A)>>

The content ratio of the repeating structural unit (a2) in the polymer (A) is usually 30% by mass or more, preferably 50% by mass or more, more preferably 70% by mass or more, and still more preferably 90% by mass or more, based on 100% by mass of the polymer (A). In such an aspect, the photosensitive resin composition tends to be superior in resolution properties, and a resin film obtained from the photosensitive resin composition tends to have low dielectric constant and low dielectric loss tangent and be superior in elongation properties. The content ratio of the repeating structural unit (a2) can be measured by $^{13}$C-NMR.

The terminal group (a1) included in the polymer (A) can be qualitatively or quantitatively analyzed by combining a matrix assisted laser desorption/ionization method, a three-dimensional nuclear magnetic resonance method, a titration method, and the like.

The weight average molecular weight (Mw) of the polymer (A) measured by a gel permeation chromatography method is usually 1,000 to 200,000, preferably 2,000 to 100,000, and still more preferably 5,000 to 100,000 in terms of polystyrene from the viewpoint of resolution properties of the photosensitive resin composition and elongation properties of the resin film obtained from the photosensitive resin composition. The details of the measurement method of Mw are as described in Example.

The polymer (A) may be used singly or two or more types of them may be used in combination.

The lower limit value of the content ratio of the polymer (A) is usually 20% by mass, preferably 40% by mass, and more preferably 60% by mass; and the upper limit value thereof is usually 99% by mass, and preferably 95% by mass, based on 100% by mass of the solid component of the composition of the present invention. When the content ratio of the polymer (A) is the lower limit value or more or the upper limit value or less, a photosensitive resin composition that can form a patterned resin film having high resolution tends to be obtained. The solid component refers to all components that can be contained in the composition of the present invention and exclude an organic solvent (D) described later.

<<Method for Producing Polymer (A)>>

The polymer (A) can be, for example, produced by polycondensation. For example, the polymer (A) can be produced by using a bisphenol compound and a dihalogen compound as monomers when X is an oxygen atom, a bisthiol compound and a dihalogen compound as monomers when X is a sulfur atom, and a dicarboxylic acid compound and a dihalogen compound as monomers when X is an ester bond.

Hereinafter, as an example of the polymer (A), a polymer (A11) in which X is an oxygen atom and the reactive group is a phenolic hydroxyl group in Formula (a1) and Formula (a2) will be explained. The polymer (A11) can be obtained by polymerizing, for example, at least a phenolic compound (aa1) having two phenolic hydroxyl groups and a halogen compound (aa2) having two halogen atoms.

In synthesis of the polymer (A11), for example, the phenolic compound (aa1) and the halogen compound (aa2) are polymerized in an appropriate polymerization solvent in the presence of an alkali metal compound. The amount of the halogen compound (aa2) used is usually less than 100 mol, and preferably 90.0 to 99.9 mol, based on 100 mol of the phenolic compound (aa1). Such an amount ratio allows a polymer having a phenolic hydroxyl group at a polymer terminal to be obtained.

Examples of the alkali metal compound include carbonates, hydrogen carbonates, and hydroxides of alkali metals such as lithium, sodium, and potassium. Among these, carbonates and hydroxides are preferable, and potassium carbonate, sodium carbonate, potassium hydroxide, and sodium hydroxide are more preferable.

Polymers (A) in which X is other than an oxygen atom in Formula (a1) and Formula (a2) can be produced by, for example, known polymerization methods.

<Crosslinking Agent (B)>

The composition of the present invention further contains a crosslinking agent (B) for the purpose of, for example, curing a patterned resin film. The crosslinking agent (B) is a crosslinking component that reacts with the reactive group in the polymer (A) by action of a cation generated from a photocation generator (C) upon light irradiation.

Examples of the crosslinking agent (B) include a crosslinking agent (b1) having at least two groups represented by —$R^{B1}$—O—$R^{B2}$ such as a methylol group and an alkoxymethyl group, a crosslinking agent having at least two oxetane rings, a crosslinking agent having at least two oxirane rings, a crosslinking agent having at least two oxazoline rings, a crosslinking agent having at least two isocyanate groups (including blocked isocyanate), and a crosslinking agent having at least two maleimide groups. Among these, the crosslinking agent (b1) is preferable. In the formula in the crosslinking agent (b1), $R^{B1}$ is an alkanediyl group, and preferably an alkanediyl group having 1 to 10 carbon atoms; and $R^{B2}$ is a hydrogen atom or an alkyl group, and preferably a hydrogen atom or an alkyl group having 1 to 10 carbon atoms.

Examples of the alkanediyl group in $R^{B1}$ include a methylene group and an ethylene group, and examples of the alkyl group in $R^{B2}$ include a methyl group, an ethyl group, a propyl group, and a butyl group.

Examples of the crosslinking agent (b1) include compounds having two or more of an amino group to which a group represented by —$R^{B1}$—O—$R^{B2}$ is bonded, methylol group-containing phenolic compounds, and alkylmethylol group-containing phenolic compounds.

Examples of the amino group to which a group represented by —R$^{B1}$—O—R$^{B2}$ is bonded include groups represented by Formula (b1-1) and groups represented by Formula (b1-2).

[chem. 5]

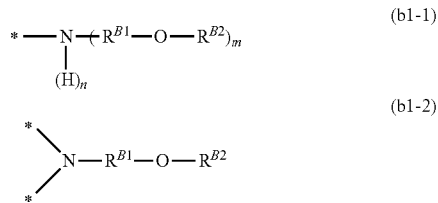

In Formula (b1-1) and Formula (b1-2), R$^{B1}$ is an alkanediyl group having 1 to 10 carbon atoms, R$^{B2}$ is a hydrogen atom or an alkyl group having 1 to 10 carbon atoms, m is 1 or 2, n is 0 or 1, m+n is 2, and * is a bonding hand.

Examples of the crosslinking agent (b1) include nitrogen atom-containing compounds such as polymethylol melamine, polymethylol glycoluril, polymethylol guanamine, and polymethylol urea; and compounds obtained by alkyl etherification of all or part of active methylol groups (CH$_2$OH groups each bonded to an N atom) in the nitrogen atom-containing compound. Alkyl groups constituting the alkyl ether may be, for example, a methyl group, an ethyl group, a propyl group, or a butyl group, and may be the same or different from each other. Further, active methylol groups that are not alkyl-etherified may be self-condensed in one molecule, or may be condensed between two molecules, resulting in the formation of an oligomer component.

Specific examples of the crosslinking agent (b1) include crosslinking agents described in JP H6-180501 A, JP 2006-178059 A, and JP 2012-226297 A. Specific examples include melamine-based crosslinking agents such as polymethylol melamine, hexamethoxymethyl melamine, hexaethoxymethyl melamine, hexapropoxymethyl melamine, and hexabutoxymethyl melamine; glycoluril-based crosslinking agents such as polymethylol glycoluril, tetramethoxymethyl glycoluril, and tetrabutoxymethyl glycoluril; and guanamine-based crosslinking agents including compounds obtained by methylolation of guanamines such as 3,9-bis[2-(3,5-diamino-2,4,6-triazaphenyl)ethyl]2,4,8,10-tetraoxospiro[5.5]undecane and 3,9-bis[2-(3,5-diamino-2,4,6-triazaphenyl)propyl]2,4,8,10-tetraoxospiro[5.5]undecane, and compounds obtained by alkyl etherification of all or part of active methylol groups in the compounds obtained by methylolation of guanamines described above.

Examples of the methylol group-containing phenolic compound and the alkylmethylol group-containing phenolic compound include 2,6-dimethoxymethyl-4-t-butylphenol and 2,6-dimethoxymethyl-p-cresol.

The crosslinking agent (B) may be used singly or two or more types of them may be used in combination.

The lower limit value of the content of the crosslinking agent (B) is usually 0.1 parts by mass, preferably 1 part by mass, and more preferably 2 parts by mass; and the upper limit value thereof is usually 40 parts by mass, preferably 30 parts by mass, and more preferably 20 parts by mass, based on 100 parts by mass of the polymer (A) in the composition of the present invention. When the content of the crosslinking agent (B) is equal to or more than the lower limit value or equal to or less than the upper limit value, a patterned resin film that is superior in resolution, heat resistance, and elongation properties tends to be formed.

<Photocation Generator (C)>

The composition of the present invention contains a photocation generator (C). The photocation generator (C) is a compound that generates a cation such as H$^+$ for facilitating a crosslinking reaction between the reactive group in the polymer (A) and the crosslinking agent (B) upon light irradiation.

It is considered that an exposure treatment on a coating film formed of the composition of the present invention allows a cation to be generated from the photocation generator (C) at an exposed portion, and the action of the cation facilitates a crosslinking reaction between the reactive group in the polymer (A) and the crosslinking agent (B) and forms a crosslinking structure at the exposed portion, leading to decrease in solubility in a developing solution.

The photocation generator (C) is preferably a photosensitive acid generator that generates an acid upon light irradiation, and examples include onium salt compounds, halogen-containing compounds, sulfone compounds, sulfonic acid compounds, sulfonimide compounds, and diazomethane compounds.

Specific examples of the onium salt compounds, the halogen-containing compounds, the sulfone compounds, sulfonic acid compounds, the sulfonimide compounds, and the diazomethane compounds include the compounds described in paragraphs to in JP 2014-186300 A, which are regarded as described in the present specification. Specific examples include the photocation generators of (C1) to (C4) in the section of Examples.

Specific examples of the halogen-containing compounds include haloalkyl group-containing hydrocarbon compounds and haloalkyl group-containing heterocyclic compounds. Specific examples of the halogen-containing compounds preferably include 1,10-dibromo-n-decane, 1,1-bis(4-chlorophenyl)-2,2,2-trichloroethane, and s-triazine derivatives such as phenyl-bis(trichloromethyl)-s-triazine, 4-methoxyphenyl-bis(trichloromethyl)-s-triazine, styryl-bis(trichloromethyl)-s-triazine, naphthyl-bis(trichloromethyl)-s-triazine, and 2-[2-(5-methylfuran-2-yl)ethenyl]-4,6-bis(trichloromethyl)-1,3,5-triazine.

The photocation generator (C) may be used singly or two or more types of them may be used in combination.

The lower limit value of the content of the photocation generator (C) is usually 0.01 parts by mass, preferably 0.1 parts by mass, and more preferably 0.5 parts by mass; and the upper limit value thereof is usually 30 parts by mass, preferably 20 parts by mass, and more preferably 10 parts by mass, based on 100 parts by mass of the polymer (A) in the composition of the present invention. When the content of the photocation generator (C) is the lower limit value or more, curing at an exposed portion is sufficient, and a patterned resin film tends to have improved heat resistance. When the content of the photocation generator (C) is the upper limit value or less, the transparency to light for use in exposure does not deteriorate, and a patterned resin film having high resolution tends to be obtained.

<Organic Solvent (D)>

The composition of the present invention preferably contains an organic solvent (D). The use of the organic solvent (D) can improve handleability and adjust viscosity and preservation stability of the composition of the present invention.

The organic solvent (D) is not particularly limited as long as it can dissolve or disperse each component such as the polymer (A), the crosslinking agent (B), and the photocation generator (C). Examples of the organic solvent (D) include ketone solvents, alcohol solvents, ether solvents, ester solvents, amide solvents, and hydrocarbon solvents.

Examples of the ketone solvents include linear ketone solvents such as acetone, methyl ethyl ketone, methyl-n-propyl ketone, methyl-n-butyl ketone, diethyl ketone, methyl-iso-butyl ketone, 2-heptanone (methyl amyl ketone), ethyl-n-butyl ketone, methyl-n-hexyl ketone, di-iso-butyl ketone, and trimethyl nonanone; cyclic ketone solvents such as cyclopentanone, cyclohexanone, cycloheptanone, cyclooctanone, and methylcyclohexanone; 2,4-pentanedione, acetonylacetone, and acetophenone.

Examples of the alcohol solvents include aliphatic monoalcohol solvents having 1 to 18 carbon atoms such as 4-methyl-2-pentanol and n-hexanol; alicyclic monoalcohol solvents having 3 to 18 carbon atoms such as cyclohexanol; polyalcohol solvents having 2 to 18 carbon atoms such as 1,2-propylene glycol; and polyalcohol partial ether solvents having 3 to 19 carbon atoms such as propylene glycol monomethyl ether.

Examples of the ether solvents include dialkyl ether solvents such as diethyl ether, dipropyl ether, dibutyl ether, dipentyl ether, diisoamyl ether, dihexyl ether, and diheptyl ether; cyclic ether solvents such as tetrahydrofuran and tetrahydropyran; and aromatic ring-containing ether solvents such as diphenyl ether and anisole.

Examples of the ester solvents include monocarboxylate solvents such as n-butyl acetate and ethyl lactate; polyalcohol carboxylate solvents such as propylene glycol acetate; polyalcohol partial ether carboxylate solvents such as propylene glycol monomethyl ether acetate; polycarboxylic acid diester solvents such as diethyl oxalate; lactone solvents such as γ-butyrolactone and δ-valerolactone; and carbonate solvents such as dimethyl carbonate, diethyl carbonate, ethylene carbonate, and propylene carbonate.

Examples of the amide solvents include cyclic amide solvents such as N,N'-dimethyl imidazolidinone and N-methyl-2-pyrrolidone; and linear amide solvents such as N-methylformamide, N,N-dimethylformamide, N,N-diethylformamide, acetamide, N-methylacetamide, N,N-dimethylacetamide, and N-methylpropionamide.

Examples of the hydrocarbon solvents include aliphatic hydrocarbon solvents having 5 to 12 carbon atoms such as n-pentane and n-hexane; and aromatic hydrocarbon solvents having 6 to 16 carbon atoms such as toluene and xylene.

The organic solvent (D) is preferably at least one type selected from the ketone solvents, the ester solvents, and the amide solvents.

The composition of the present invention can contain one, two or more types of organic solvents (D).

The content of the organic solvent (D) in the composition of the present invention is set such that the solid component concentration in the composition is usually 10 to 50% by mass.

<Other Components>

The composition of the present invention can contain, in addition to each of the components described above, other components to such an extent as not to impair the object and characteristics of the present invention. Examples of the other components include polymers other than the polymer (A); and additives such as low-molecular weight phenolic compounds, adhesion aids, crosslinked fine particles, leveling agents, surfactants, sensitizers, inorganic fillers, and quenchers.

The molecular weight of the low-molecular weight phenolic compound is usually 1000 or less, and preferably 800 or less. When a low-molecular weight phenolic compound is used, the lower limit value of the content of the low-molecular weight phenolic compound is usually 1 part by mass; and the upper limit value thereof is usually 50 parts by mass, based on 100 parts by mass of the polymer (A) in the composition of the present invention.

Examples of the surfactant include fluorine-based surfactants, silicone-based surfactants, and polyalkylene oxide-based surfactants. When a surfactant is used, the lower limit value of the content of the surfactant is usually 0.0001 parts by mass; and the upper limit value thereof is usually 1 part by mass, based on 100 parts by mass of the polymer (A) in the composition of the present invention.

<Method for Producing Photosensitive Resin Composition>

The composition of the present invention can be produced by uniformly mixing respective components constituting the composition of the present invention. To remove foreign matters, the respective components are uniformly mixed, and then the obtained mixture can be filtered with a filter or the like.

<Characteristics of Photosensitive Resin Composition>

A patterned resin film obtained from the composition of the present invention is superior in elongation properties. This is probably because of the following reason. The polymer (A) substantially has the reactive group only at a polymer chain terminal, and when the composition of the present invention is subjected to a crosslinking treatment, crosslinking occurs such that the polymer chain in the polymer (A) is chain-extended. It is accordingly considered that the crosslinking density is low, while the polymer chains are entangled greatly, leading to the occurrence of mild interaction between polymer chains. As such, it is assumed that the obtained patterned resin film can have improved elongation properties.

The patterned resin film obtained from the composition of the present invention has low dielectric constant and low dielectric loss tangent. To obtain such low dielectric characteristics, a polymer to be used preferably has a small dipole moment in the minor axis direction (a direction perpendicular to the main chain direction of the polymer) of the repeating structural unit, and the polymer (A) is suitable from this viewpoint. Further, since crosslinking mainly occurs at the polymer chain terminal and not in the repeating structural unit (a2) of the polymer (A) as described above, it is assumed that change in the dipole moment is small via the formation of the patterned resin film.

A coating film composed of the composition of the present invention can be developed with a developing solution containing an organic solvent as described later. If an aqueous solution containing an alkaline compound is used as a developing solution, a functional group having high polarity and high hygroscopicity such as a phenolic hydroxyl group may be introduced in a repeating structural unit of a polymer in order to impart alkali developability to the polymer. In this case, it is considered that a large amount of the functional group having high polarity is introduced in the polymer, resulting in high dielectric constant and dielectric loss tangent. In the present invention, a developing solution containing an organic solvent can be used to form a patterned resin film. The use of such a developing solution allows the amount of the functional group having high polarity introduced in the polymer to be decreased and thus enables low dielectric constant and low dielectric loss tangent.

[Method for Producing Resin Film Having Pattern]

A method for producing a resin film having a pattern (patterned resin film) of the present invention includes: a step (1) of forming a coating film of a composition of the present invention on a substrate; a step (2) of selectively exposing the coating film; and a step (3) of developing the coating film after exposure with a developing solution containing an organic solvent.

<Step (1)>

In the step (1), the composition of the present invention is usually coated on a substrate such that the thickness of the finally obtained patterned resin film is, for example, 0.1 to 100 μm. The substrate after coating with the composition is usually heated at 50 to 140° C. for 10 to 360 seconds using an oven or a hotplate. In this manner, a coating film composed of the composition of the present invention is formed on the substrate.

Examples of the substrate include a silicon wafer, a compound semiconductor wafer, a wafer with a metal thin film, a glass substrate, a quartz substrate, a ceramic substrate, and an aluminum substrate; and a substrate having a semiconductor chip on the surface of each of these substrates. Examples of the coating method include a dipping method, a spray method, a bar coating method, a roll coating method, a spin coating method, a curtain coating method, a gravure printing method, a silk screen method, and an inkjet method.

<Step (2)>

In the step (2), the coating film is selectively exposed using, for example, a contact aligner, a stepper, or a scanner. "Selectively" specifically means "via a photomask on which a predetermined mask pattern is formed".

Examples of light for exposure include ultraviolet light and visible light. Usually, light having a wavelength of 200 to 500 nm (e.g. i-ray (365 nm)) is used. The irradiation amount by exposure is usually 100 to 1500 mJ/cm$^2$, although the exposure amount varies depending on the kinds of respective components in the composition of the present invention, the blending ratio of the components, and the thickness of the coating film.

In order to sufficiently proceed with a crosslinking reaction, a heating treatment (after-exposure baking) is preferably performed after exposure. The condition of the heating treatment after exposure is usually 70 to 250° C., and preferably 80 to 200° C., for about 1 to 60 minutes, although it varies depending on the contents of respective components in the composition of the present invention and the thickness of the coating film.

<Step (3)>

In the step (3), the coating film after exposure is developed with a developing solution containing an organic solvent, and an unexposed portion is dissolved and removed to form a desired patterned resin film on the substrate. Examples of the development method include a shower development method, a spray development method, an immersion development method, and a paddle development method. The condition of the development is usually at 20 to 40° C. for about 1 to 10 minutes.

The developing solution contains one, two or more types of organic solvents. Examples of the developing solution include organic solvents such as ketone solvents, alcohol solvents, ether solvents, ester solvents, amide solvents, and hydrocarbon solvents, and solutions containing these organic solvents. Specific examples of these organic solvents include compounds exemplified as the organic solvent (D). Among these, at least one type selected from the ketone solvents, the ester solvents, and the amide solvents is preferable. Examples of components other than the organic solvent in the developing solution include water, a silicone oil, and a surfactant.

The content ratio of the organic solvent in the developing solution is preferably 80% by mass or more, more preferably 90% by mass or more, still more preferably 95% by mass or more, and specifically preferably 99% by mass or more.

After the coating film after exposure is developed with a developing solution containing an organic solvent to form a patterned resin film, the patterned resin film can be washed with water or the like and dried.

The shape of the pattern in the patterned resin film is not particularly limited as long as it has a recess and projection structure, and examples include a line and space pattern, a dot pattern, a hole pattern, and a lattice pattern.

<Step (4)>

After the step (3), the method for producing a patterned resin film of the present invention can have, as needed, a step (4) of sufficiently curing the patterned resin film by a heating treatment (post-baking) in order to sufficiently exhibit the characteristics as an insulating film. The condition of the curing is not particularly limited, and the patterned resin film is heated, for example, at a temperature of 100 to 250° C. for about 30 minutes to 10 hours, according to the use of the patterned resin film.

The patterned resin film obtained by the production method of the present invention can be suitably used as an insulating film (e.g. surface protection film, interlayer insulating film, and flattened film) of a semiconductor circuit substrate.

[Semiconductor Circuit Substrate]

The use of the composition of the present invention enables a semiconductor circuit substrate containing the resin film having a pattern (patterned resin film) described above to be produced. The semiconductor circuit substrate has a patterned resin film, and preferably has a patterned insulating film such as a surface protection film, an interlayer insulating film, and a flattened film, formed of the composition of the present invention described above, and is therefore useful as a high-frequency circuit substrate.

EXAMPLES

Hereinafter, the present invention will be further specifically explained with reference to Examples; however, it is not limited to these Examples. In the following description of Examples or the like, "part" means "part by mass" unless otherwise noted.

<1> Synthesis of Polymer (A)

<1-1> Method for Measuring Weight Average Molecular Weight (Mw) of Polymer (A)

Mw was measured by a gel permeation chromatography method in the following conditions.

Column: product name "TSKgelα-M" (manufactured by Tosoh Corporation)·
Solvent: N-methyl-2-pyrrolidone
Temperature: 40° C.
Detection method: refractive index method
Standard material: polystyrene
GPC apparatus: apparatus name "HLC-8320-GPC" manufactured by Tosoh Corporation <1-2> Synthesis of Polymer (A)

[Synthesis Example 1] Synthesis of Polymer (A1)

To a four-neck flask were added 894.96 mmol of 4,6-dichloropyrimidine as a halogen compound, 900.00 mmol of 1,1-bis(4-hydroxyphenyl)-3,3,5-trimethylcyclohexane as a phenolic compound, 1.2 mol of potassium carbonate as an alkali metal compound, and N-methyl-2-pyrrolidone (0.5 g based on 1 mmol of the total amount of the halogen compound and the phenolic compound) as a polymerization solvent. The inside of the flask was purged with nitrogen. Thereafter, the contents in the flask were heated at 130° C. for 6 hours, and water generated during the heating was removed with a Dean-Stark tube as required. The contents in the flask were cooled to the room temperature. Thereafter, the deposited solid matters were filtered out, methanol was added to the filtrate, the deposited solid matters were washed with methanol, and these solid matters were dried to obtain a polymer (A1). The obtained polymer (A1) was analyzed by $^{13}$C-NMR or the like, and it was revealed to be a polymer having a structure represented by Formula (A1). The weight average molecular weight (Mw) of the polymer (A1) was 87,000.

In Formulae (A2) to (A4), m, n, and o represent that the structure in [ ] is a repeating structural unit.

Synthesis Example 5

In a four-neck flask, 16.80 mmol of 1,1-bis(4-hydroxyphenyl)-3,3,5-trimethylcyclohexane and 39.20 mmol of bisphenol A as phenolic compounds, 117.60 mmol of sodium hydroxide as an alkali metal compound, and 0.39 mmol of tri-n-butyl benzyl ammonium chloride as a phase-transfer catalyst were dissolved in 240 g of ion exchanged water to prepare an aqueous phenolic-compound solution. Terephthaloyl dichloride (27.85 mmol) and isophthaloyl dichloride (27.85 mmol) as halogen compounds were dissolved in 200 ml of toluene to prepare a halogen compound solution.

The halogen compound solution was dropwise added in the four-neck flask, while the aqueous phenolic-compound solution was being stirred. After the addition, the mixture

[chem. 6]

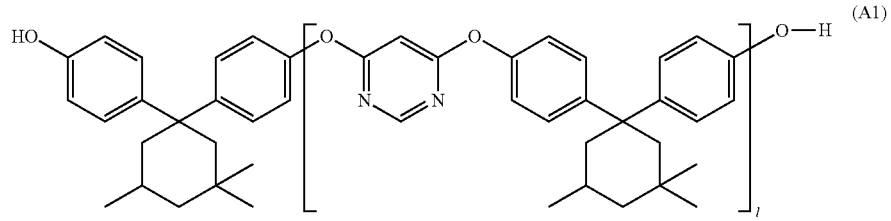

(A1)

In Formula (A1), l represents that the structure in [ ] is a repeating structural unit.

[Synthesis Examples 2 to 4] Synthesis of Polymers (A2) to (A4)

Polymers (A2) to (A4) were synthesized in the same manner as in Synthesis Example 1, except for using the compounds shown in Table 1 as a halogen compound and a phenolic compound and the amounts thereof. The structures of the polymers (A2) to (A4) were shown in Formulae (A2) to (A4), and the weight average molecular weights thereof (Mw) were shown in Table 1 described below.

was stirred at 23° C. for 3 hours. Acetic acid was added to the four-neck flask to neutralize the alkali metal. The mixture was allowed to stand to be separated into a water layer and an organic layer, followed by removal of the water layer. The organic layer was washed with ion exchanged water multiple times and then fed into a large amount of methanol. The deposited solid matters were filtered out and dried to obtain a polymer (A5). The obtained polymer (A5) was analyzed by $^{13}$C-NMR or the like, and it was revealed to be a polymer having a structure represented by Formula (A5). The weight average molecular weight (Mw) of the polymer (A5) was 57,000.

[chem. 7]

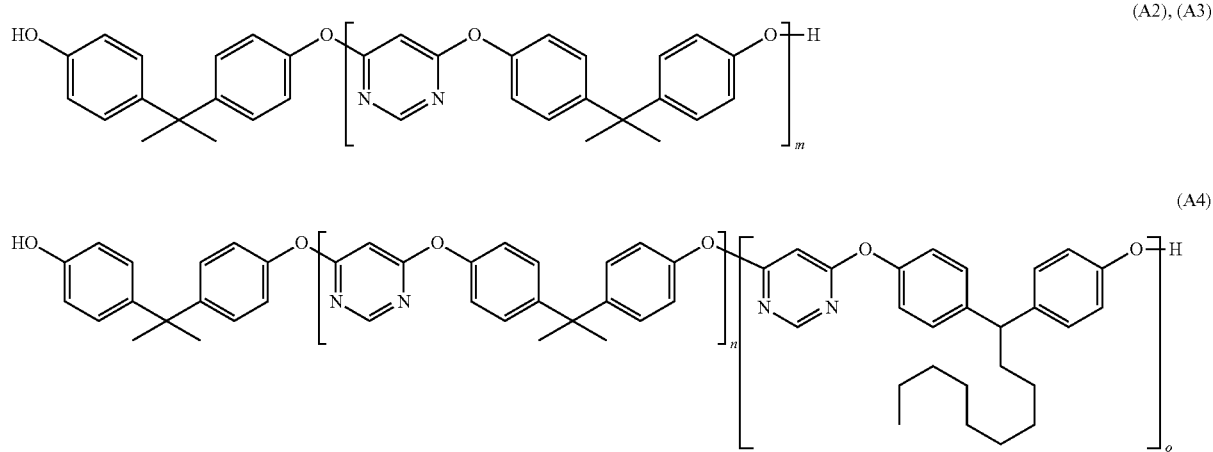

[chem. 8]

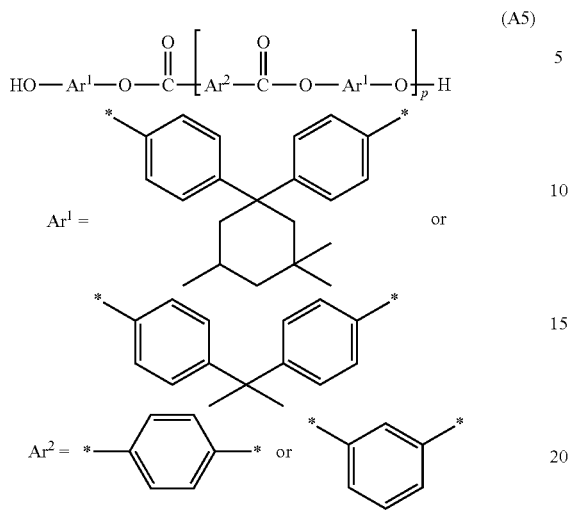

(A5)

In Formula (A5), p represents that the structure in [ ] is a repeating structural unit. * represents a bonding hand.

TABLE 1

|  | Polymer | Halogen compound | | Phenolic compound | | Mw |
| --- | --- | --- | --- | --- | --- | --- |
|  |  | Type | Amount (mmo) | Type | Amount (mmol) |  |
| Synthesis Example 1 | A1 | 4,6-Dichloropyrimidine | 894.96 | 1,1-Bis(4-hydroxyphenyl)-3,3,5-trimethylcyclohexane | 900.00 | 87,000 |
| Synthesis Example 2 | A2 | 4,6-Dichloropyrimidine | 795.20 | Bisphenol A | 800.00 | 58,000 |
| Synthesis Example 3 | A3 | 4,6-Dichloropyrimidine | 792.00 | Bisphenol A | 800.00 | 26,000 |
| Synthesis Example 4 | A4 | 4,6-Dichloropyrimidine | 145.50 | Bisphenol A | 75.00 | 20,000 |
|  |  | — | — | 1,1-Bis(4-hydroxyphenyl)decane | 75.00 |  |
| Synthesis Example 5 | A5 | Terephthaloyl dichloride | 27.85 | 1,1-Bis(4-hydroxyphenyl)-3,3,5-trimethylcyclohexane | 16.80 | 57,000 |
|  |  | Isophthaloyl dichloride | 27.85 | Bisphenol A | 39.20 |  |

<2> Production of Photosensitive Resin Composition

Examples 1A to 10A and Comparative Examples 1A to 2A

The photosensitive resin compositions of Examples 1A to 10A and Comparative Examples 1A to 2A were produced by uniformly mixing polymers, crosslinking agents, photoinitiators, and other components shown in Table 2 in the amounts shown in Table 2 to achieve a solid component concentration of 20% by mass using the organic solvents shown in Table 2.

The details of respective components used in production of the photosensitive resin composition are shown as below.

(A1): polymer (A1) polymerized in Synthesis Example 1
(A2): polymer (A2) polymerized in Synthesis Example 2
(A3): polymer (A3) polymerized in Synthesis Example 3
(A4): polymer (A4) polymerized in Synthesis Example 4
(A5): polymer (A5) polymerized in Synthesis Example 5
(RA1): a resin obtained by radical polymerization of p-vinylphenol/styrene=80/20 (mol %) (the weight average molecular weight in terms of polystyrene is 10,000)
(RA2): a hydrogenated A-B block copolymer (A=a 4-hydroxystyrene-derived structural unit, B=an isoprene-derived structural unit, A/B=50/50 (mol %), the hydrogenation ratio is 99% or more, the weight average molecular weight in terms of polystyrene is 10,000)
(RA3): a polyamic acid resin having a structural unit represented by Formula (RA3)

[chem. 9]

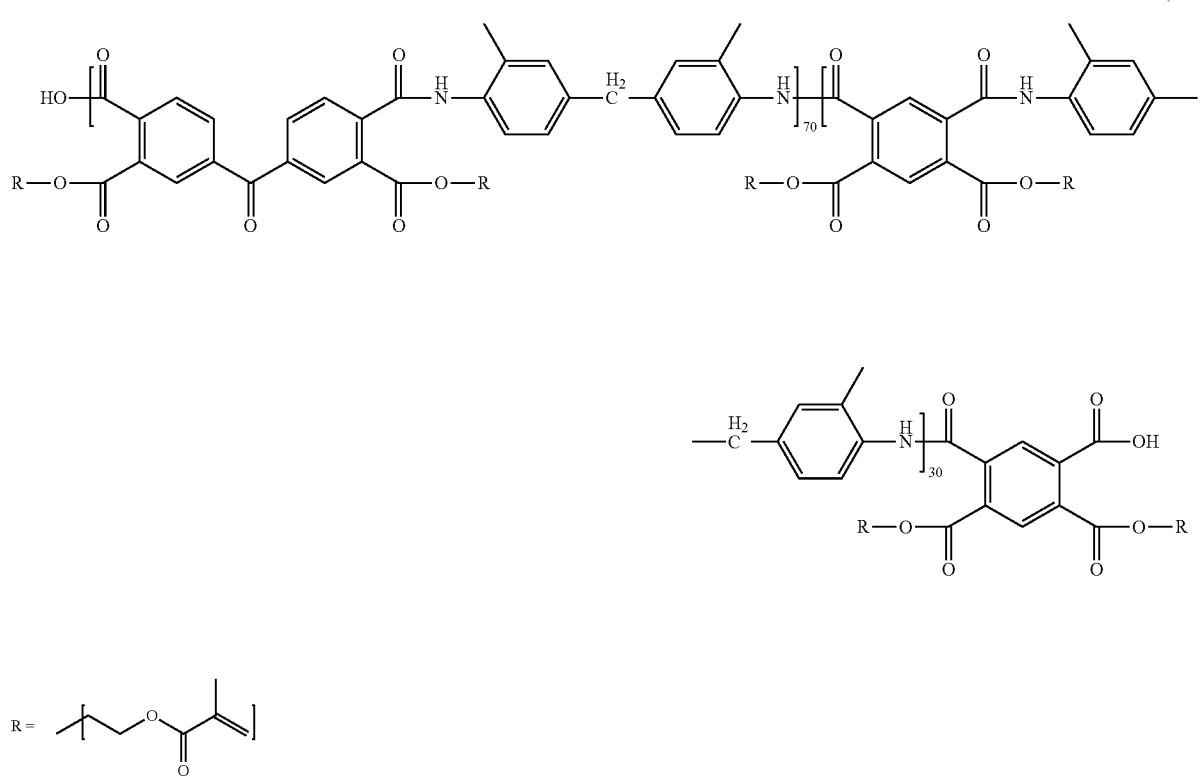

In Formula (RA3), the subscripts (70, 30) of [ ] mean the content ratios (70 mols, 30 mol %) of respective structural units in the polyamic acid resin.

(B1): hexamethoxymethyl melamine (trade name "cymel 300", manufactured by Mitsui Chemicals, Inc.)

(B2): trimethylolpropane polyglycidyl ether (trade name "denacol EX-321L", manufactured by Nagase ChemteX Corporation)

(RB1): tetraethylene glycol dimethacrylate (C1): 2-[2-(5-methylfuran-2-yl)ethenyl]-4,6-bis-(trichloromethyl)-1,3,5-triazine (C2): a photocation generator represented by Formula (C2)

[chem. 10]

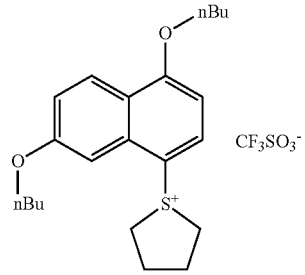

In Formula (C2), nBu represents n-butyl group.

(C3): product name "CPI-210S" (manufactured by San-Apro Ltd.)

(C4): a photocation generator represented by Formula (C4)

[chem. 11]

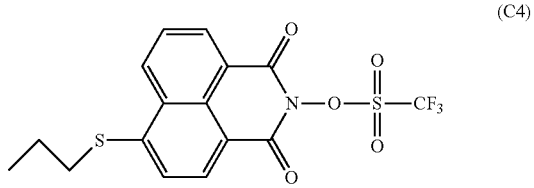

(RC1): product name "IRGACURE OXE01" (manufactured by BASF SE)

(RC2): a condensate of 1,1-bis(4-hydroxyphenyl)-1-[4-[1-(4-hydroxyphenyl)-1-methylethyl]phenyl]ethane and 1,2-naphthoquinone diazide-5-sulfonic acid (molar ratio=1:2)

(D1): methyl amyl ketone (D2): cyclohexanone (D3): propylene glycol monomethyl ether acetate (D4): N-methyl-2-pyrrolidone (E1): a fluorine-based surfactant, trade name "NBX-15" (manufactured by Neos Corporation)

(E2): a compound represented by Formula (E2)

[chem. 12]

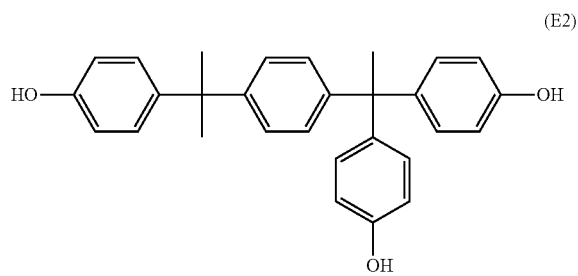

(E2)

B: A pattern with a cube shape having 50 μm length, 50 μm width, and 6 μm height was not able to be formed.

<3-2> Elongation

Each of the photosensitive resin compositions was coated on a substrate having a mold release material and then heated with an oven at 110° C. for 5 minutes to prepare a coating film. Next, the entire surface of the coating film was irradiated with ultraviolet light from a high-pressure mercury lamp using an aligner (manufactured by Suss Microtec SE, model "MA-150") such that the exposure amount at a wavelength of 365 nm was 500 mJ/cm². Next, the coating film after exposure was heated with a hotplate in a nitrogen

TABLE 2

| Component | | Example 1A | Example 2A | Example 3A | Example 4A | Example 5A | Example 6A | Example 7A | Example 8A | Example 9A | Example 10A | Comparative Example 1A | Comparative Example 2A |
|---|---|---|---|---|---|---|---|---|---|---|---|---|---|
| Polymer (part by mass) | A1 | 100 | 100 | | 100 | 100 | | | | | | | |
| | A2 | | | 100 | | | | | | | | | |
| | A3 | | | | | | 100 | 100 | 100 | | | | |
| | A4 | | | | | | | | | 100 | | | |
| | A5 | | | | | | | | | | 100 | | |
| | RA1 | | | | | | | | | | | 50 | |
| | RA2 | | | | | | | | | | | 50 | |
| | RA3 | | | | | | | | | | | | 100 |
| Crosslinking agent (part by mass) | B1 | 5 | 10 | 5 | 5 | 5 | 15 | 15 | 15 | 15 | 15 | 10 | |
| | B2 | | | | | | | | | | | 5 | |
| | RB1 | | | | | | | | | | | | 4 |
| Photoinitiator (part by mass) | C1 | 1 | 1 | 1 | | | | | | | | | |
| | C2 | | | | 3 | | 3 | | | 3 | 3 | | |
| | C3 | | | | | 3 | | 3 | | | | | |
| | C4 | | | | | | | | 3 | | | | |
| | RC1 | | | | | | | | | | | | 4 |
| | RC2 | | | | | | | | | | | 25 | |
| Other component (part by mass) | E1 | 0.05 | 0.05 | 0.05 | 0.05 | 0.05 | 0.05 | 0.05 | 0.05 | 0.05 | 0.05 | 0.05 | 0.05 |
| | E2 | | | | | | 10 | 10 | 10 | 10 | | | |
| Organic solvent type | | D1 | D1 | D2 | D1 | D1 | D2 | D2 | D2 | D2 | D2 | D3 | D4 |

<3> Evaluations

The following evaluations were performed for the photosensitive resin compositions of Examples and Comparative Examples.

The results are shown in Table 3.

<3-1> Resolution Properties

Each of the photosensitive resin compositions was spin-coated on a silicon wafer of 6 inch and then heated using a hotplate at 110° C. for 5 minutes to prepare a coating film. Next, the coating film was exposed to ultraviolet light from a high-pressure mercury lamp through a photomask using an aligner (manufactured by Suss Microtec SE, model "MA-150") such that the exposure amount at a wavelength of 365 nm was 500 mJ/cm². Next, the coating film after exposure was heated with a hotplate in a nitrogen atmosphere under the heating conditions described in the column of "after-exposure baking" shown in Table 3, and subsequently developed by immersion using the developing solution shown in Table 3 at 23° C. for 3 minutes. The coating film after development was heated with an oven in a nitrogen atmosphere under the heating conditions described in the column of "post-baking" shown in Table 3 to produce a resin film having a pattern. The produced resin film having a pattern was observed with an electron microscope and evaluated based on the following criteria:

A: A pattern with a cube shape having 50 μm length, 50 μm width, and 6 μm height was able to be formed.

atmosphere under the heating conditions described in the column of "after-exposure baking" shown in Table 3, and further heated with an oven in a nitrogen atmosphere under the heating conditions described in the column of "post baking" shown in Table 3.

The coating film after heating by post-baking was released from the substrate having a mold release material to obtain a resin film having a thickness of 15 μm. The obtained resin film was cut into a strip shape having 2.5 cm length× 0.5 cm width. The tensile elongation at break (δ) of the strip-shaped resin film was measured by a tensile compression testing machine (product name "SDWS-0201 type" manufactured by IMADA-SS Corporation) The measurement conditions were as follows: distance between chucks=2.5 cm, tensile speed=5 mm/min, and measurement temperature=23° C. The result shows an average value of five measured values.

<3-3> Dielectric Characteristics

Each of the photosensitive resin compositions was coated on a substrate having a mold release material and then heated with an oven at 110° C. for 5 minutes to prepare a coating film. Next, the entire surface of the coating film was irradiated with ultraviolet light from a high-pressure mercury lamp using an aligner (manufactured by Suss Microtec SE, model "MA-150") such that the exposure amount at a wavelength of 365 nm was 500 mJ/cm². Next, the coating film after exposure was heated with a hotplate in a nitrogen atmosphere under the heating conditions described in the column of "after-exposure baking" shown in Table 3, and further heated with an oven in a nitrogen atmosphere under the heating conditions described in the column of "post baking" shown in Table 3.

The coating film after heating by post-baking was released from the substrate having a mold release material to obtain a resin film having a thickness of 10 μm. The relative dielectric constant ($\varepsilon_r$) and the dielectric loss tangent (tan δ) at 10 GHz of the obtained resin film were measured under the conditions of 23° C. and relative humidity 50% RH by a cavity resonator perturbation method using a dielectric characteristics measuring apparatus (a cavity resonator for 10 GHZ, manufactured by KANTO Electronic Application and Development Inc.).

TABLE 3

| Photosensitive resin composition | After-exposure baking | Post-baking | Developing solution | Resolution properties | Elongation | Relative dielectric constant | Dielectric loss tangent |
|---|---|---|---|---|---|---|---|
| Example 1A | 210° C./3 min | 200° C./1 hr | Cyclohexanone | A | 15% | 2.3 | 0.004 |
| Example 2A | 210° C./3 min | 200° C./1 hr | Cyclohexanone | A | 15% | 2.3 | 0.005 |
| Example 3A | 210° C./3 min | 200° C./1 hr | Cyclopentanone | A | 100% | 2.7 | 0.005 |
| Example 4A | 150° C./3 min | 200° C./1 hr | Cyclopentanone | A | 15% | 2.4 | 0.007 |
| Example 5A | 210° C./3 min | 200° C./1 hr | Cyclopentanone | A | 15% | 2.4 | 0.006 |
| Example 6A | 150° C./3 min | 200° C./1 hr | Cyclopentanone | A | 47% | 2.8 | 0.007 |
| Example 7A | 210° C./3 min | 200° C./1 hr | Cyclopentanone | A | 27% | 2.7 | 0.006 |
| Example 8A | 150° C./3 min | 200° C./1 hr | Cyclopentanone | A | 16% | 2.6 | 0.007 |
| Example 9A | 150° C./3 min | 200° C./1 hr | Cyclopentanone | A | 39% | 2.5 | 0.005 |
| Example 10A | 150° C./3 min | 200° C./1 hr | Cyclopentanone | A | 50% | 2.5 | 0.006 |
| Comparative Example 1A | — | 200° C./1 hr | *1 | A | 23% | 2.6 | 0.03 |
| Comparative Example 2A | — | 250° C./1 hr | Cyclopentanone | A | 15% | ≥3.0 | ≥0.01 |
| Comparative Example 2A | — | 200° C./1 hr | Cyclopentanone | A | <10% | ≥3.0 | ≥0.01 |

*1: 2.36 wt % Aqueous tetramethylammonium hydroxide solution

The invention claimed is:

1. A method for producing a semiconductor circuit substrate having a patterned insulating film, the method comprising:
    forming a coating film on a substrate by applying a photosensitive resin composition;
    selectively exposing the coating film;
    developing the coating film after exposure with a developing solution comprising an organic solvent to form a patterned resin film;
    heating the patterned resin film at a temperature of 100 to 250° C. for 30 minutes to 10 hours; and
    forming the semiconductor circuit using the heated patterned resin film as the patterned insulating film on the substrate,
    the photosensitive resin composition comprises:
    a polymer (A) comprising a terminal group represented by Formula (a1) and a repeating structural unit represented by Formula (a2);
    a crosslinking agent (B); and
    a photocation generator (C), $$-X-R^1-Y \quad (a1)$$

$$\left[R^2-X-R^1-X\right] \quad (a2)$$

wherein in Formula (a1) and Formula (a2),
    Y represents a reactive group that reacts with the crosslinking agent (B) by action of a cation generated from the photocation generator (C) upon light irradiation;
    each X independently represents an oxygen atom, a sulfur atom, an ester bond, or —SO$_2$—;
    $R^1$ represents a divalent hydrocarbon group or a divalent group into which a functional group other than the reactive group or heterocycles is introduced;
    $R^2$ represents a divalent hydrocarbon group, a divalent group into which a functional group other than the reactive group or heterocycles is introduced, or a heterocycle-containing group that does not have the reactive group;
    when X is an oxygen atom, each $R^1$ independently represents formula (a1-1), formula (a1-2), formula (a1-3), or formula (a1-4), and $R^2$ is a heterocycle-containing group that does not have the reactive group,
wherein a molar amount of the terminal group represented by formula (a1) in the polymer (A) relative to a total molar amount of terminal groups in the polymer (A) is more than 50 mol %, (a1-1)

(a1-2)

-continued

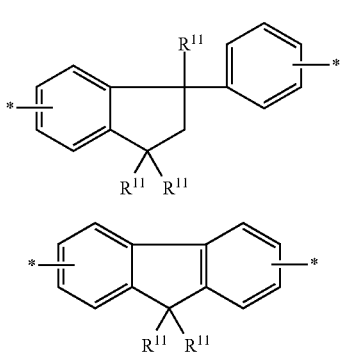

(a1-3)

(a1-4)

wherein * is a bonding hand, in formula (a1-1), each Z independently represents a phenylene group or a divalent hydrocarbon group having 9 to 20 carbon atoms which is an alkanediyl group, an aryl group-substituted alkanediyl group, or a cycloalkanediyl group, and n is an integer of 0 to 3, and in formulae (a1-2) to (a1-4), each $R^{11}$ is independently a hydrogen atom or an alkyl group, wherein the group which reacts with the crosslinking agent (B) is present only at a terminal of a main chain of the polymer (A), wherein when a dielectric loss tangent (tan δ) at 10 GHz of the coating film is measured under the conditions of 23° C. and relative humidity 50% RH by a cavity resonator perturbation method, the dielectric loss tangent is 0.007 or less, and wherein when the coating film has a thickness of 15 μm, the tensile elongation measured under conditions of distance between chucks=2.5 cm, tensile speed=5 mm/min, and measurement temperature=23° C. is 15% or more.

2. The method according to claim 1, wherein in the formula (a1-1), each Z independently represents a decane-1,1-diyl group, a diphenylmethylene group, a 3,3,5-trimethylcyclohexane-1,1-diyl group, or a phenylene group.

3. The method according to claim 1, wherein in formula (a1-1), each Z independently represents a phenylene group or a divalent hydrocarbon group having 9 to 20 carbon atoms which is an alkanediyl group.

4. The method according to claim 1, wherein the reactive group is a phenolic hydroxyl group.

5. The method according to claim 1, wherein $R^1$ is an arylene group.

6. The method according to claim 1, wherein $R^2$ is a group in which two hydrogen atoms are removed from pyrimidine, or an arylene group.

7. The method according to claim 1, wherein the crosslinking agent (B) is a crosslinking agent that has at least two methylol groups or alkoxymethyl groups.

8. The method according to claim 1, wherein the polymer (A) is a linear polymer.

9. The method according to claim 1, wherein a content ratio of the repeating structural unit represented by Formula (a2) in the polymer (A) is 90% by mass or more.

10. The method according to claim 1, wherein a weight average molecular weight (Mw) of the polymer (A) measured by a gel permeation chromatography method is from 5,000 to 100,000.

11. The method according to claim 1, wherein a content of the crosslinking agent (B) in the photosensitive resin composition is from 2 to 20 parts by mass with respect to 100 parts by mass of the polymer (A).

12. The method according to claim 1, wherein the photocation generator (C) is a photosensitive acid generator.

13. The method according to claim 1, wherein a content of the photocation generator (C) is from 0.5 to 10 parts by mass with respect to 100 parts by mass of the polymer (A).

14. The method according to claim 1, wherein the reactive group is a phenolic hydroxyl group, $R^1$ is an arylene group, $R^2$ is a group in which two hydrogen atoms are removed from pyrimidine, or an arylene group, the crosslinking agent (B) is a crosslinking agent that has at least two methylol groups or alkoxymethyl groups, the polymer (A) is a linear polymer, and the photocation generator (C) is a photosensitive acid generator.

15. The method according to claim 14, wherein a content ratio of the repeating structural unit represented by Formula (a2) in the polymer (A) is 90% by mass or more, a content of the crosslinking agent (B) in the photosensitive resin composition is from 2 to 20 parts by mass with respect to 100 parts by mass of the polymer (A), and a content of the photocation generator (C) is from 0.5 to 10 parts by mass with respect to 100 parts by mass of the polymer (A).

* * * * *